United States Patent
Wakisaka et al.

(10) Patent No.: US 7,177,082 B2
(45) Date of Patent: Feb. 13, 2007

(54) LENS ARRAY FOR IMAGE SENSOR AND IMAGE-SCANNING DEVICE INCORPORATING THE LENS ARRAY

(75) Inventors: Masahide Wakisaka, Tokyo (JP); Hiroyuki Nemoto, Tokyo (JP); Takashi Kishimoto, Tokyo (JP); Harunobu Yoshida, Tokyo (JP)

(73) Assignee: Nippon Sheet Glass Co., Ltd., Tokyo (JP)

( * ) Notice: Subject to any disclaimer, the term of this patent is extended or adjusted under 35 U.S.C. 154(b) by 30 days.

(21) Appl. No.: 10/923,552

(22) Filed: Aug. 20, 2004

(65) Prior Publication Data

US 2005/0040321 A1 Feb. 24, 2005

(30) Foreign Application Priority Data

Aug. 21, 2003 (JP) ............................. 2003-208140

(51) Int. Cl.
*G02B 27/10* (2006.01)

(52) U.S. Cl. ...................... 359/619; 359/622; 358/511

(58) Field of Classification Search ........ 359/619–623; 355/33, 34; 358/511, 514
See application file for complete search history.

(56) References Cited

U.S. PATENT DOCUMENTS

| 5,956,163 | A | * | 9/1999 | Clarke et al. ............... 358/509 |
| 6,801,345 | B1 | * | 10/2004 | Imamura .................... 358/509 |
| 2005/0002105 | A1 | * | 1/2005 | Nemoto et al. ............ 359/619 |

FOREIGN PATENT DOCUMENTS

JP 2001-358906 12/2001

* cited by examiner

*Primary Examiner*—Huy Mai
(74) *Attorney, Agent, or Firm*—Merchant & Gould P.C.

(57) ABSTRACT

A lens array 4 is formed as an erect 1:1 imaging lens by superimposing two lens plates 40 and 40 together. Each lens plate 40 consists of a number of micro lenses 41 which are regularly provided at a predetermined pitch and in a two-dimensional manner. This lens plate 40 is for example made by press molding the ultraviolet curing resin in a soft condition using a transparent mold and by irradiating the ultraviolet light on the ultraviolet curing resin from outside for hardening. Since the lens array 4 is provided with micro lenses 41 in rows in a sub-scanning direction, deterioration of an amount of light level resulting from the displacement between a light axis of the lens and an image sensor 6 is not generated.

7 Claims, 10 Drawing Sheets

(a)

(b)

LENS ARRAY FOR IMAGE SENSOR AND IMAGE-SCANNING DEVICE INCORPORATING THE LENS ARRAY

BACKGROUND OF THE INVENTION

1. Field of the Invention

The present invention relates to a lens array for converging the light from a document on a sensor (i.e., a light-receiving element) and an image-scanning device such as a copying machine, a facsimile machine, and a scanner in which the lens array is incorporated.

2. Description of the Prior Art

A contact-type image sensor in which an erecting 1:1 imaging lens (i.e., an erecting unit magnification lens) is incorporated can be made thin because the number of parts used is smaller than that of a reduced type image sensor. In this manner, the contact-type image sensor is used as an image-scanning device (i.e., an image sensor unit) such as a facsimile machine, a copying machine, and a hand scanner.

FIG. 9 is an entire structural view of a conventional contact-type image-scanning device shown in the following Patent Document 1. A casing 102 for housing a light guide 101 and a rod lens array 103 are disposed within a frame 100. A cover glass 104 is provided at the upper part of the frame 100 and a base plate 106 mounting a line image sensor (i.e., a light-receiving element) 105 thereon is provided at the lower part thereof. An illuminating light emitted from a light- emitting surface of the light guide 101 is caused to be incident on a document through the cover glass 104 and the reflected light is detected by the line image sensor 105 through the rod lens array 103, thereby scanning the document.

FIG. 10 is a perspective view of the rod lens array 103. The rod lens array 103 consists of a number of rod lenses 103a of which both ends are sandwiched between resin plates 103b. Black resin is filled between the rod lenses 103a.

[Patent Document]

Patent Document 1: Japanese Unexamined Patent Publication No. 2001-358906

The frame of the image sensor unit is generally a resin-molded article. Thus, the frame cannot be molded with a high degree of accuracy and its self-shape retention is also low. In this manner, it is difficult to install the rod lens array without inclination and as shown in FIG. 10, the displacement ($\Delta y$) is produced between the light axis of the rod lens array and the line image sensor.

FIG. 11 shows the result whereby the relationship between this displacement ($\Delta y$) and an amount of light level was verified along the longitudinal direction (i.e., a main scanning direction). It can be seen from FIG. 11 that the larger the displacement ($\Delta y$), the much lower the amount of light level.

In this manner, if deterioration of the amount of light level takes place, deformation in line is caused to lower the image quality when, for example, a linear image such as a ruled line is scanned.

To solve this problem, a rod lens array has been adopted in which the rod lenses are disposed in two rows in a sub-scanning direction. However, since the production cost becomes high even in rod lens array in one row, to have the rod lens array disposed in two rows makes the production yield worse to increase the cost. Further, even though the rod lenses are provided in two rows, it is not possible to completely eliminate the displacement of light axis.

On the other hand, if a micro lens array is employed, it is easy to have the lens disposed in many rows, but in the case of an ordinary micro lens array, it is not possible to provide an erect 1:1 imaging lens.

Further, in the case of the contact-type image-scanning device, there is also a problem of the deterioration in resolution resulting from the elevation of a document as well as the displacement between the light axis of the rod lens array and the line image sensor. In other words, when, for example, a book is mounted on a glass plate (i.e., a document table) in the open condition, a portion between pages is inevitably elevated.

In the conventional image-scanning device, since the irradiated light from an illuminating device is designed to be concentrated substantially on the glass plate (the document desk), the amount of light irradiated becomes uneven at a portion where the document is elevated to cause the resolution to deteriorate.

Further, even though the amount of light irradiated is dispersed to a certain degree in accordance with the elevation of the document, there is still a problem of focal depth. In other words, in order not to cause the resolution to deteriorate even though there is some elevation of the document, it is imperative to make the focal depth of the lens large.

FIG. 12 is a graph showing the relationship among an angle of aperture of the lens, the focal depth, and the amount of light transmitted. As is obvious from this graph, the focal depth and the amount of light transmitted are in a trade-off relationship. For example, the angle of aperture of the rod lens must be 6 degrees to correspond to a document elevation of 1 mm, but the amount of light transmitted in the case of the angle of aperture of 6 degrees becomes about 0.3%, which is very small. Thus, an insufficient amount of light results.

SUMMARY OF THE INVENTION

To solve the above-mentioned problems, a lens array for an image sensor according to the present invention is formed as an erect 1:1 imaging lens by superimposing lens plates, wherein each lens plate consists of a number of micro lenses which are regularly disposed at a predetermined pitch and in a two-dimensional manner.

In this manner, by using the lens plate with lenses formed in many rows even in a sub-scanning direction, deterioration of an amount of light level resulting from the displacement ($\Delta y$) between the light axis and the line image sensor can be eliminated.

The lens array is formed by vertically superimposing, for example, two or three lens plates, wherein the center of micro lenses of the upper lens plate agrees with the center of micro lenses of the lower lens plate.

Further, by setting an angle of aperture of a single lens of the lens array between 4 and 10 degrees, it is possible to satisfy both an amount of light transmitted and a depth of focus.

The present invention also includes an image-scanning device in which the lens array for an image sensor, an illuminating device, and a light-receiving element are incorporated in a frame. In particular, the illuminating device of the image-scanning device is provided with a light guide which reflects the light incident from an end face on the inner surface and causes the light to be emitted from a light-emitting surface provided along the longitudinal direction. The light guide is provided with two kinds of reflective curved surfaces and the collecting position of the light reflected by each curved surface differs. In this manner, it is possible to effectively prevent the deterioration of the amount of light level resulting from the elevation of a document.

A cross-sectional shape of the two kinds of reflective curved surfaces in the direction perpendicular to the longitudinal direction of the light guide is considered to be an oval arc or a parabola. In the case where a pair of right and left illuminating devices is incorporated in the image-scanning device, it is possible to exhibit the same effect as above by changing the height of each illuminating device.

In the image-scanning device, a ghost cut section can be provided between the lens array for an image sensor and the light-receiving element and/or on at least one of the upper parts of the lens array for an image sensor.

BRIEF DESCRIPTION OF THE DRAWINGS

The above and other objects, features and advantages of the present invention will become more apparent from the following description when taken in conjunction with the accompanying drawings.

DETAILED DESCRIPTION OF THE PREFERRED EMBODIMENTS

Preferred embodiments of the present invention will now be described with reference to the accompanying drawings.

Figure 1:
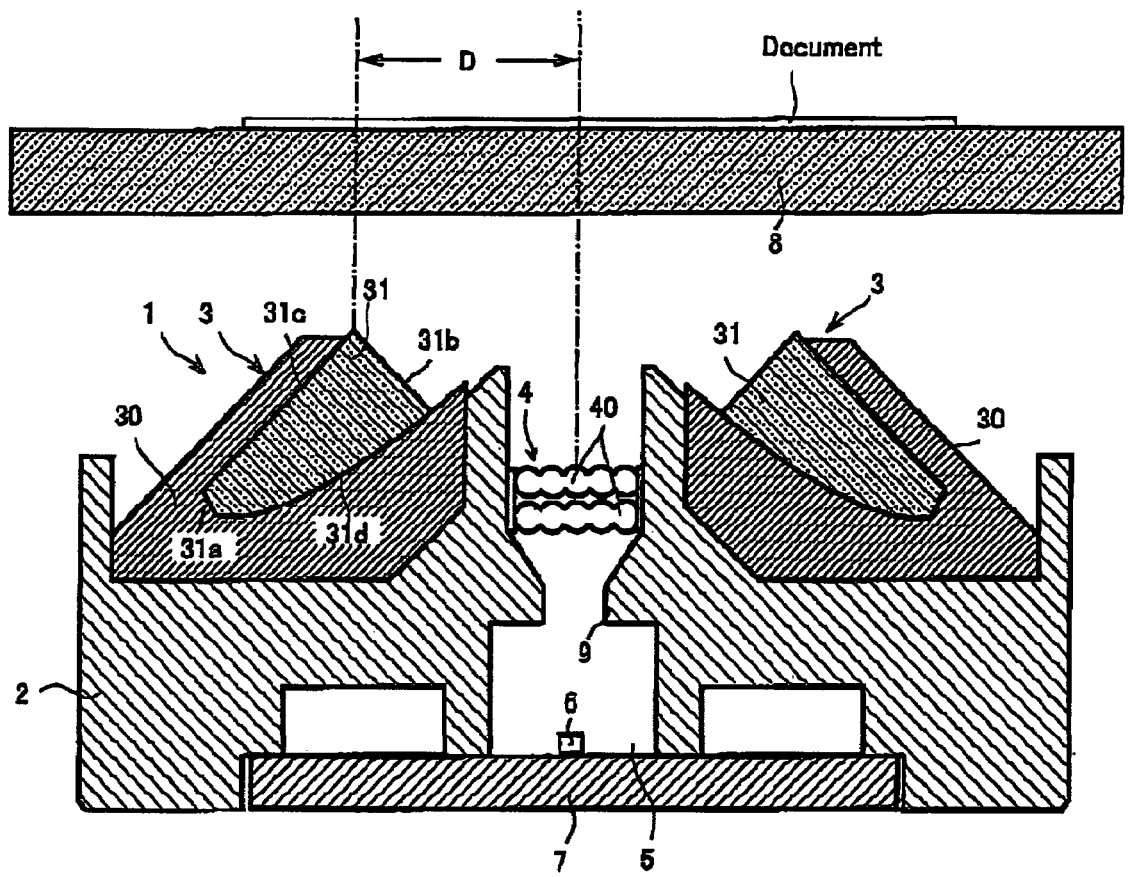
FIG. 1 is a cross-sectional view of an image-scanning device in which a lens array according to the present invention is incorporated.
Figure 2:
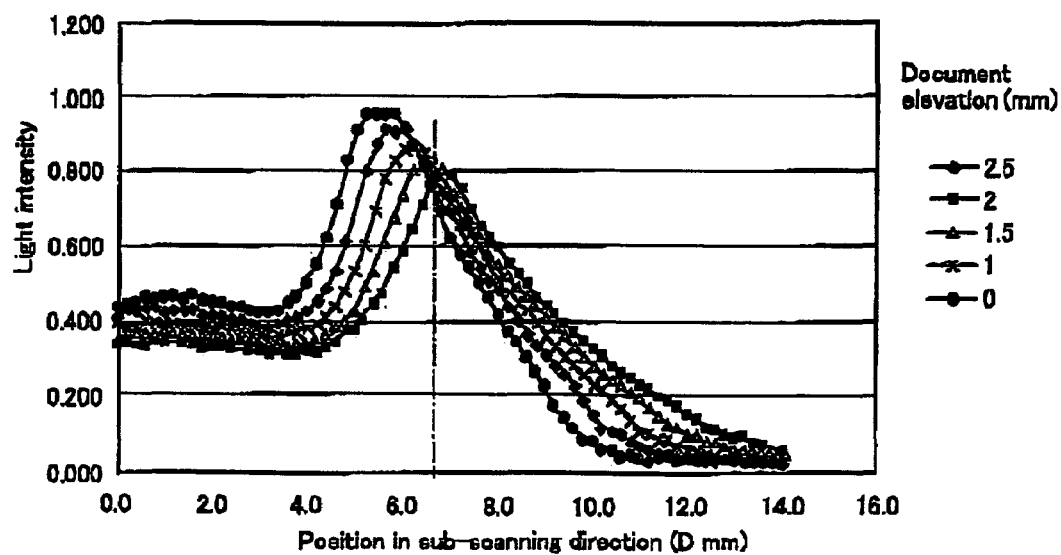
FIG. 2 is a graph showing the relationship between a position in a sub-scanning direction and the intensity of light for each amount of elevation of a document surface.
Figure 3:
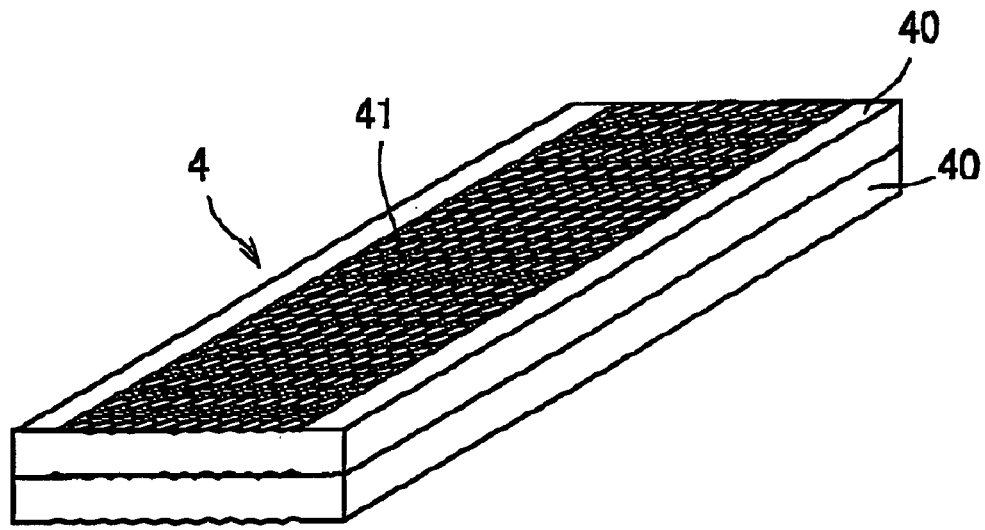
FIG. 3 is a perspective view of the lens array according to the present invention.
Figure 4:
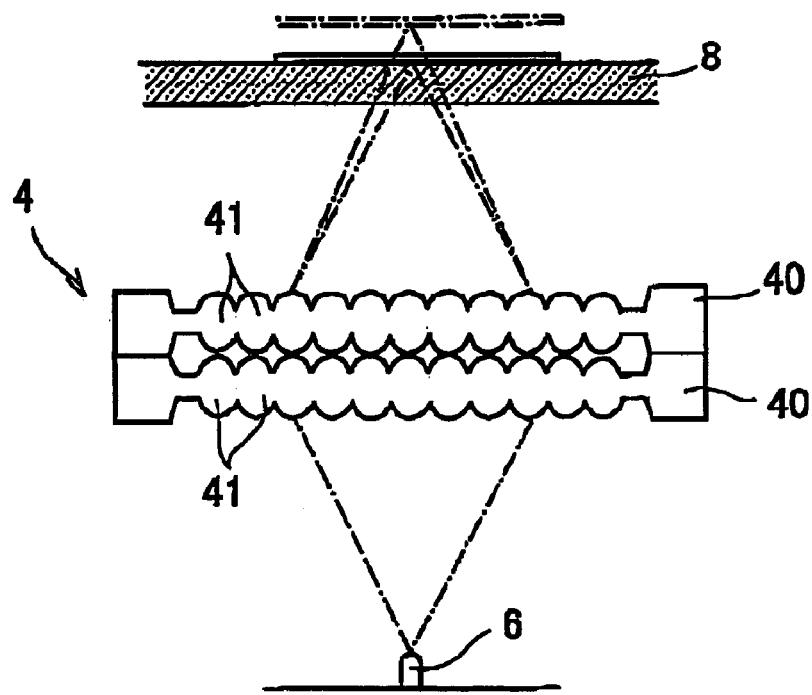
FIG. 4 is a view explaining the image formation by the lens array according to the present invention.

FIG. 1 is a cross-sectional view of an image-scanning device in which a lens array according to the present invention is incorporated. FIG. 2 is a perspective view of the lens array according to the present invention. FIG. 3 is a graph showing the relationship between a position in a sub-scanning direction and the intensity of light for each amount of elevation of a document surface. FIG. 4 is a view explaining the image formation by the lens array according to the present invention.

An image-scanning device 1 is transversely provided with line-illuminating devices 3 and 3 within a frame 2 and a lens array 4 is disposed between these line-illuminating devices 3 and 3. Formed at the lower part of the frame 2 is a depressed section 5 on which a base plate 7 to which an image sensor (i.e., a light-receiving element) 6 is secured is mounted. A glass plate 8 on which a document is mounted is provided above the line-illuminating devices 3 and 3 and the lens array 4. The image sensor (the light-receiving element) 6 is provided at such a location as to substantially agree with a location where the centerline of the lens array 4 extends.

Part of the frame 2 below the lens array 4 is narrowed down to provide a ghost cut section 9.

The line-illuminating device 3 is provided with a casing 30 which houses a bar-shaped light guide 31 made of acrylic resin and the like. The light guide 31 has an end on the major axis side of which the cross-sectional shape in the direction perpendicular to the longitudinal direction is substantially one quarter (¼) oval. The end of the light guide 31 is chamfered. This chamfered surface 31a includes the focus of the oval and is provided with a light-scattering pattern.

The surface of the light guide 31 along the longitudinal direction consists of the chamfered surface 31a, a light-emitting surface 31b parallel to the minor axis direction of the oval, a reflective surface 31c parallel to the major axis direction of the oval, and a reflective surface 31d of which the cross-section reflecting the scattered light from the light-scattering pattern toward the light-emitting surface 31b is substantially one quarter (¼) oval.

Movement of a peak of the light intensity characteristics relative to the elevation of a document surface mainly depends on the inclination of the light axis of the illuminating light. The light intensity characteristics depend on the width of the scattering pattern formed on the chamfered surface. In this manner, it is possible to substantially cause the characteristic curves to agree by the inclination of the light guide 31 and the width of the scattering pattern.

FIG. 2 is a graph showing the relationship between a position (D) of the left light guide 31 in a sub-scanning direction and the light intensity for each elevation of the document surface in FIG. 1. It can be seen from this graph that the light intensity can be maintained at about 0.8 irrespective of an amount of elevation of the document by setting the position (D) in the sub-scanning direction between 6.5 and 7.0 mm.

On the other hand, as shown in FIG. 3, the lens array 4 is formed as an erecting 1:1 imaging lens by superimposing two lens plates 40 and 40 together. Each lens plate 40 consists of a number of micro lenses 41 which are regularly disposed at a predetermined pitch and in a two-dimensional manner. This lens plate 40 can be made, for example, by press molding the ultraviolet curing resin in a soft condition using a transparent mold and by irradiating the ultraviolet light on the resin from outside for hardening (i.e., a 2P molding method).

As a molding method, the glass or resin softened by heating can be press molded, or pre-molded lenses can be laminated.

Operation of the lens array 4 is shown in FIG. 4. The light from the light-emitting surface 31b of the light guide 31 reflected on the document surface is converged on the image sensor (i.e., the light-receiving element) 6 through the lens array 4. In this case, since the lens array 4 is provided with micro lenses 41 in rows in the sub-scanning direction, such deterioration of an amount of light level as seen in the conventional lens array resulting from displacement between the lens axis and the image sensor 6 does not occur. As described above, it is possible to satisfy both the focal depth and the amount of light transmitted by setting an angle of aperture of the micro lenses 41 between 4 and 10 degrees.

Figure 5:
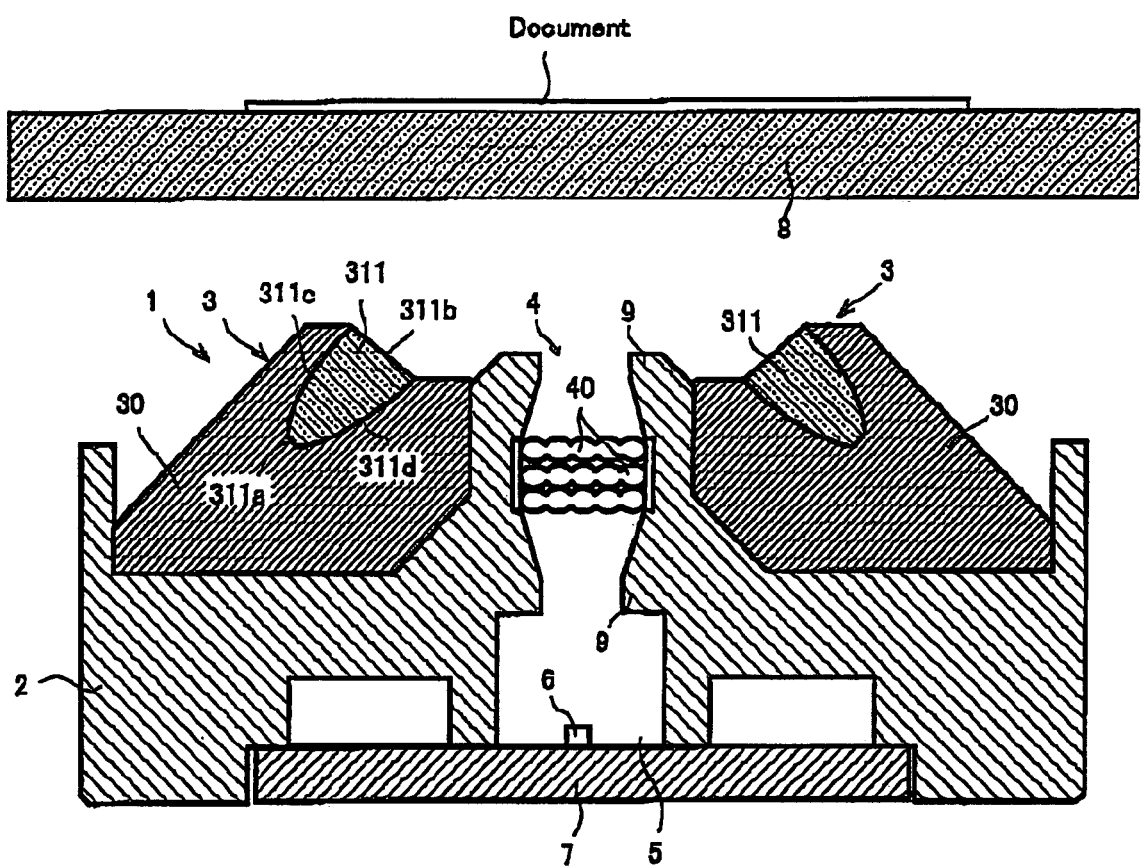
FIG. 5 is a view similar to FIG. 1 showing another embodiment.

FIG. 5 is a view similar to FIG. 1 showing another embodiment. In this embodiment, a light guide 311 is provided with two kinds of reflective curved surfaces 311c and 311d. The cross-sectional shape of these reflective curved surfaces 311c and 311d in the direction perpendicular to the longitudinal direction of the light guide is an oval arc or a parabola to emit the light from a surface 311a where a scattering pattern is formed from the light-emitting surface 311b, thereby causing the collecting position (a vertical position) of the light emitted to be different.

In the embodiment as shown in FIG. 5, the lens array 4 consists of three lens plates 40 and ghost cut sections 9 for cutting the stray light which generate a ghost are provided above and below the lens array 4. However, it is to be noted that the ghost cut section 9 can be provided only above the lens array 4.

Figure 6:
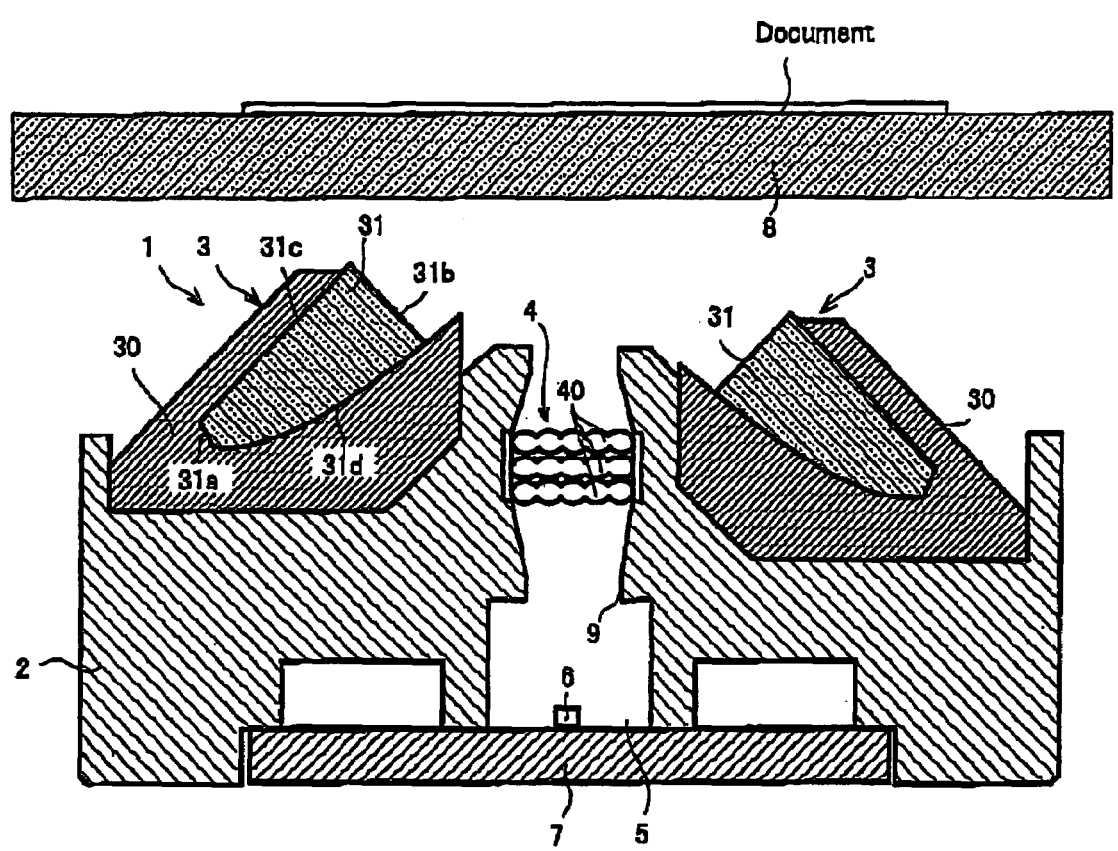
FIG. 6 is a view similar to FIG. 1 showing still another embodiment.

FIG. 6 is also a view similar to FIG. 1 showing still another embodiment. In this embodiment, the height of right and left light guides 31 is changed.

In this manner, by adopting the reflective surfaces of which the light-collecting position differs or by changing the height of right and left light guides, it is possible to make the change of light distribution rate smaller even though there is elevation of the document.

In the embodiment as shown in FIG. 6, the ghost cut section 9 is provided with a slit structure. Namely, the ghost cut section 9 is vertically provided with a partition wall 9a corresponding to a pitch of the lens, wherein if the lens array is a hexagonal close-packed structure, the slit is honeycomb-shaped as seen from above, while if the lens array is a tetragonal close-packed structure, the slit is grid-shaped as seen from above.

In the figure, two kinds of reflective curved surfaces 311c and 311d are oppositely provided, but the oval arc or the parabola of which the focal position differs can be continuously formed on one surface.

Figure 7:
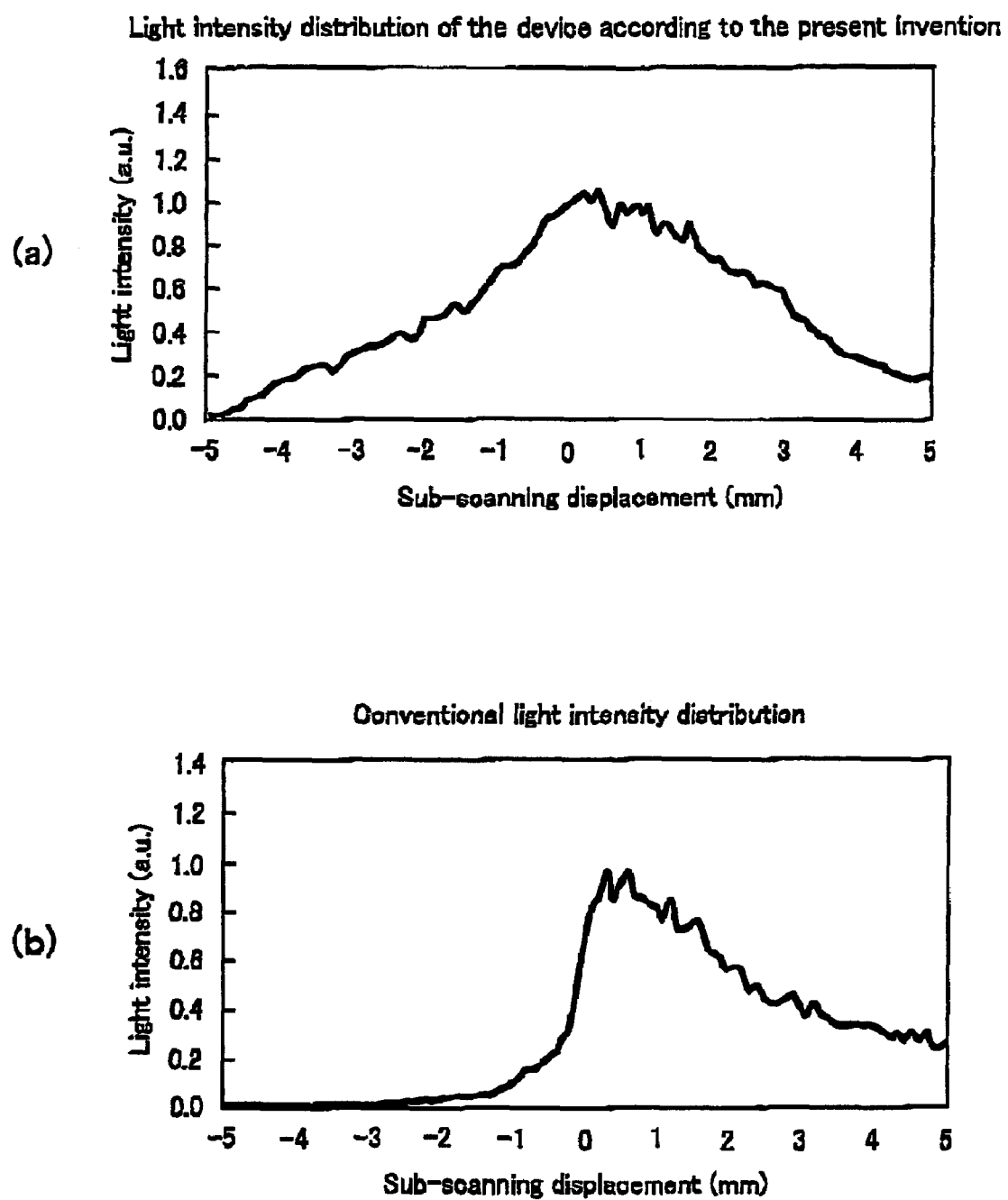
FIG. 7(a) is a graph showing the relationship between the sub-scanning displacement and the intensity of light of the image-scanning device in which the lens array according to the present invention is incorporated.
FIG. 7(b) is a graph showing the relationship between the sub-scanning displacement and the intensity of light of a conventional image-scanning device.

FIG. 7(a) is a graph showing the relationship between the sub-scanning displacement and the light intensity of the image-scanning device in which the lens array according to the present invention is incorporated. FIG. 7(b) is a graph showing the relationship between the sub-scanning displacement and the light intensity of the conventional image-scanning device. In the lens array according to the present invention, since a plurality of lenses is provided, as shown in FIG. 7(a), the light intensity of more than 80% is maintained in the range of −0.5 mm through +1 mm from the central position in the sub-scanning direction. However, in the conventional light guide, it can be seen that the light intensity deteriorates extremely in the case of 0 mm or less as shown in FIG. 7(b).

Figure 8:
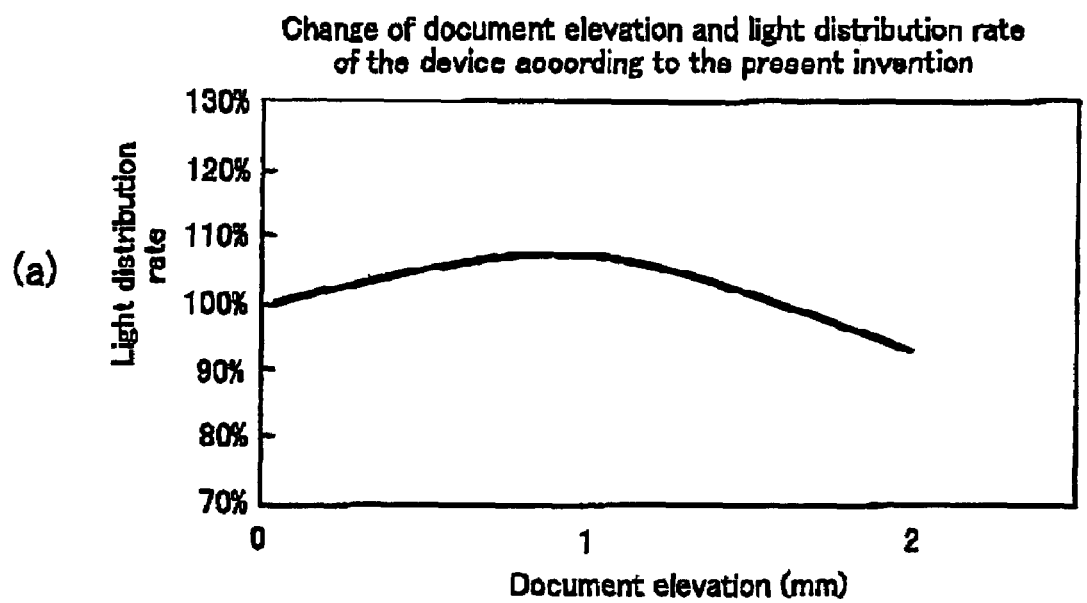
FIG. 8(a) is a graph showing the relationship between an amount of elevation of the document surface and the light distribution rate of the image-scanning device in which the lens array is incorporated.
FIG. 8(b) is a graph showing the relationship between the amount of elevation of the document surface and the light distribution rate of the conventional image-scanning device.
Figure 8:
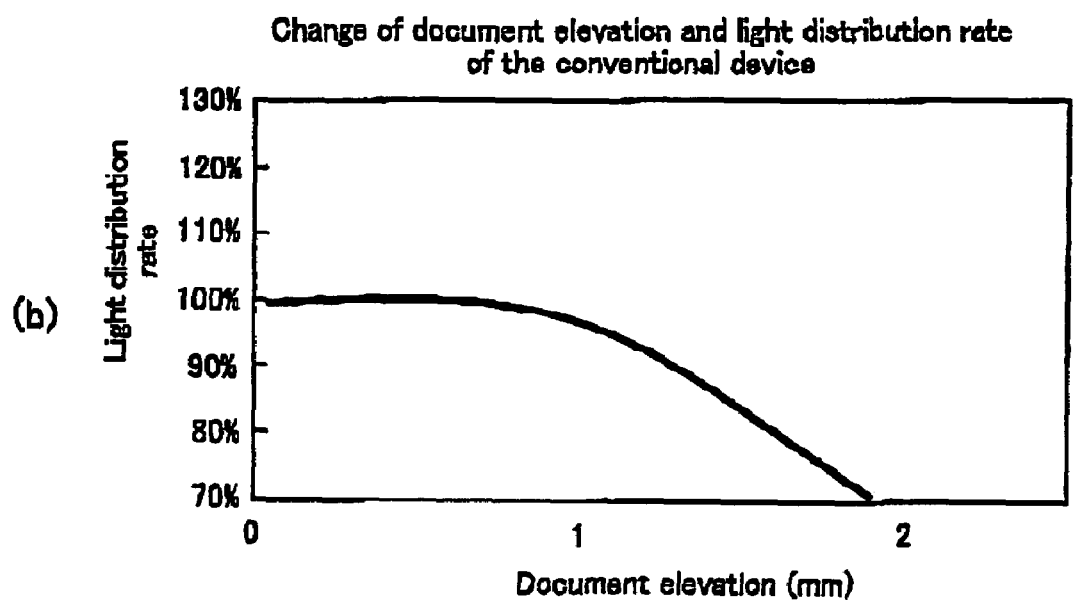
Figure 9:
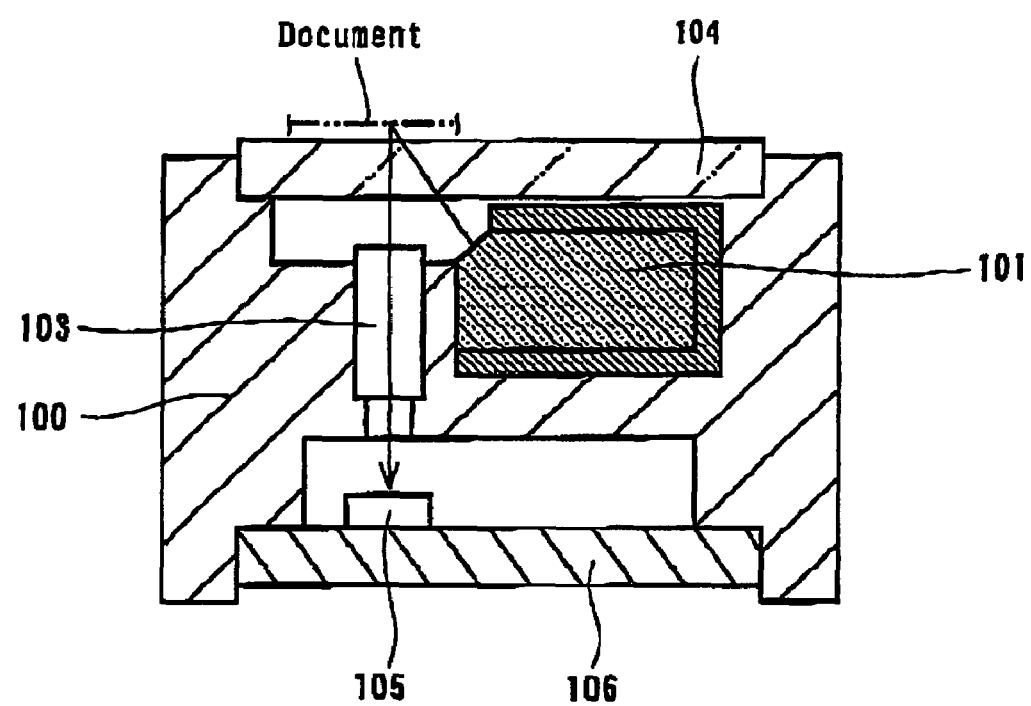
FIG. 9 is a cross-sectional view of the conventional image-scanning device.
Figure 10:
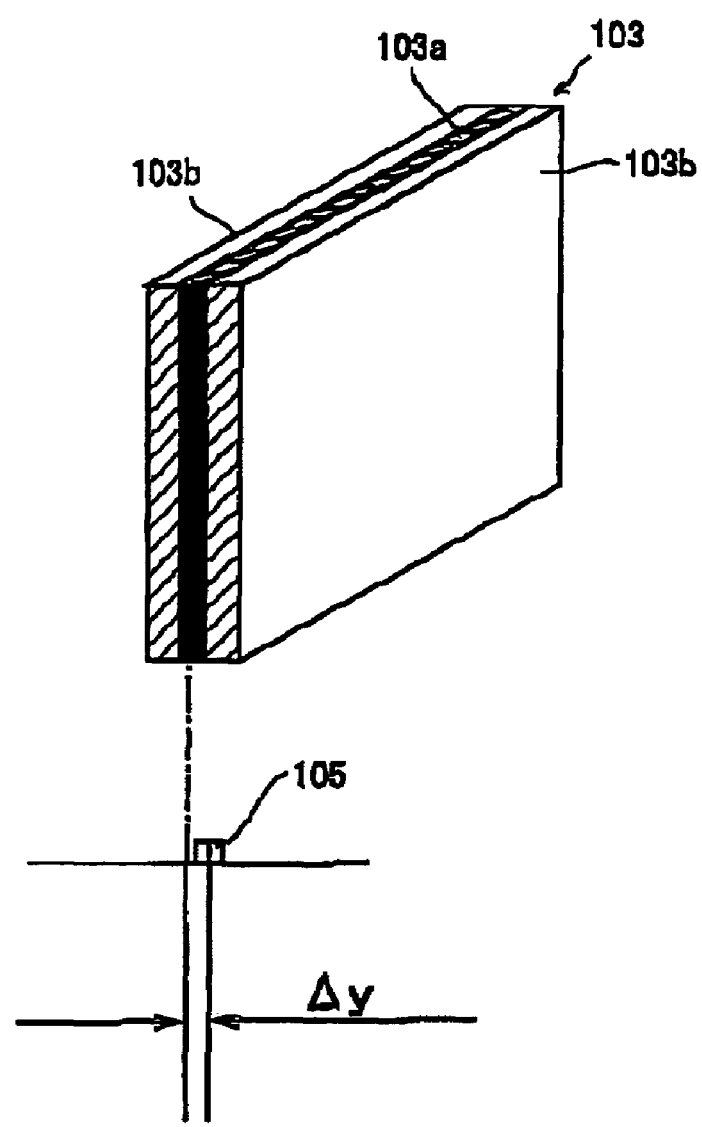
FIG. 10 is a perspective view of the conventional lens array.
Figure 11:
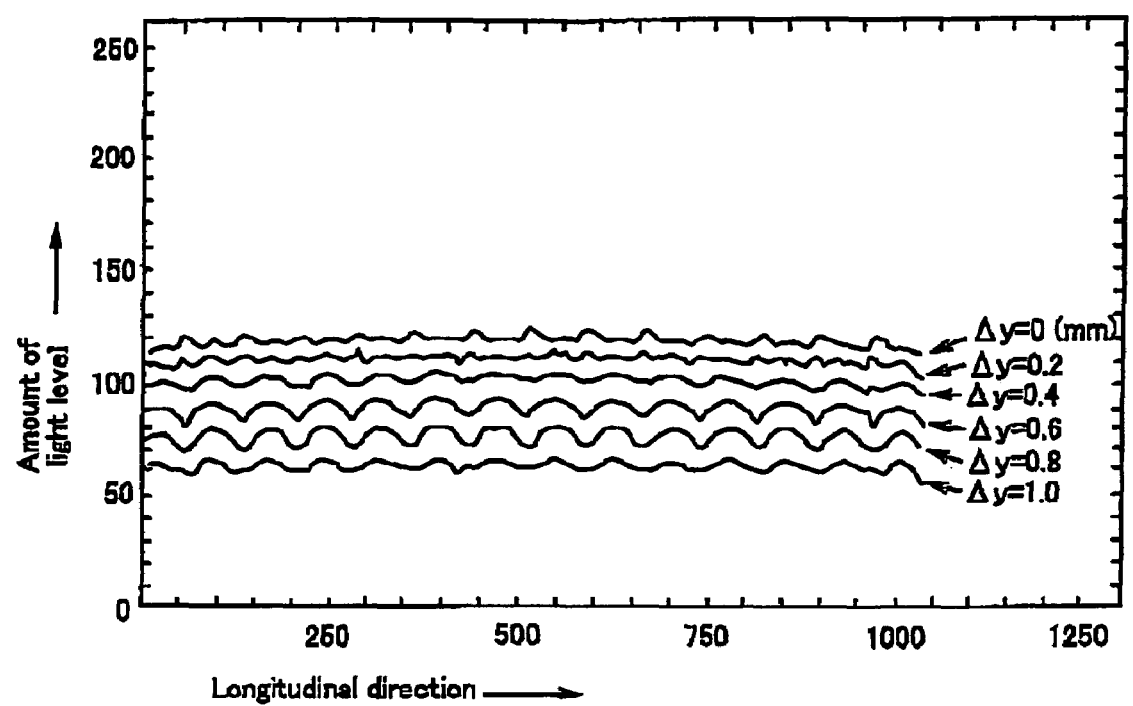
FIG. 11 is a graph showing the relationship between the displacement ($\Delta y$) between the light axis and the light-receiving element of the lens array and an amount of light level, in the conventional image-scanning device.
Figure 12:
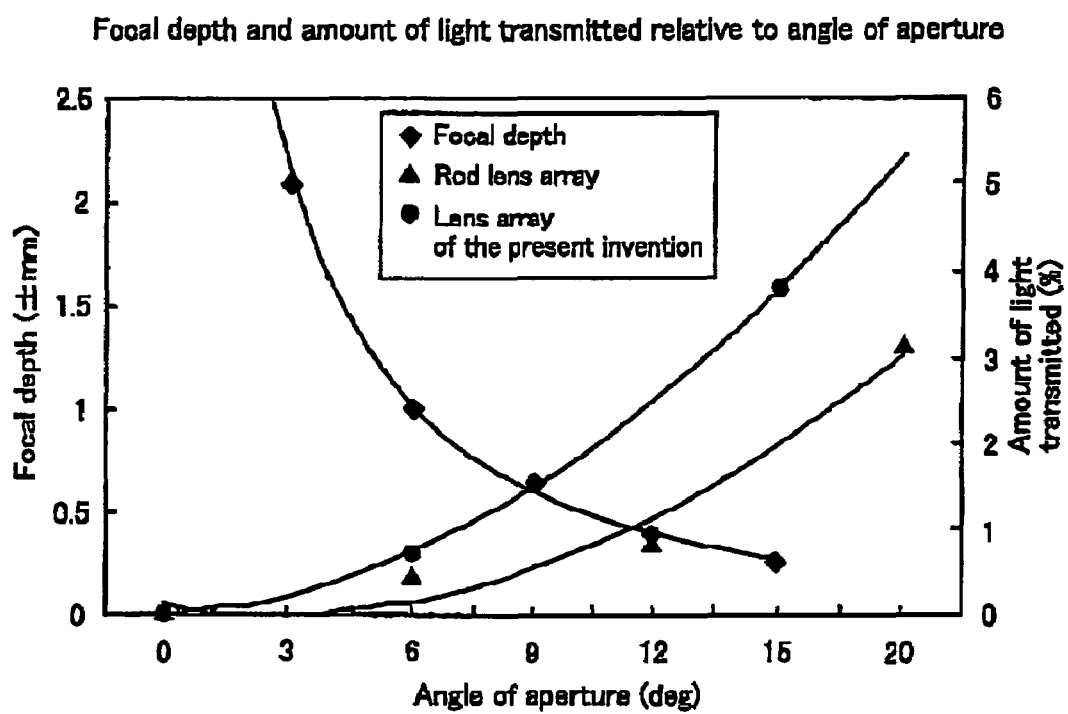
FIG. 12 is a graph showing the relationship among an angle of aperture, the depth of focus, and an amount of light transmitted, of the lens.

Further, FIG. 8(a) is a graph showing the relationship between an amount of elevation of the document surface and a light distribution rate of the image-scanning device in which the lens array according to the present invention is incorporated. FIG. 8(b) is a graph showing the relationship between the amount of elevation of the document surface and the light distribution rate of the conventional image-scanning device. In the lens array according to the present invention, since the depth of focus is deep, the light distribution rate of more than 90% is maintained even in the case where the elevation of the document surface is 2 mm as shown in FIG. 8(a). However, in the conventional light guide, it can be seen that if the elevation of the document surface is less than about 1.3 mm, the light distribution rate deteriorates extremely as shown in FIG. 8(b).

As described above, according to the present invention, the lens array to be incorporated in the image-scanning device is formed as the erecting 1:1 imaging lens by superimposing lens plates in which a number of micro lenses is regularly disposed at a predetermined pitch and in a two-dimensional manner. In this manner, it is possible to control the deterioration of the amount of light level resulting from the displacement between the light axis of the lens and the image sensor (the light-receiving element) and to prevent deformation of image from generating in the case of scanning the linear image.

Further, according to the present invention, even though the illuminating image focus location is vertically widened and the depth of focus is deepened accordingly, it is possible to scan the image of high resolution even in the case where the elevation of the document surface is large because the deterioration of the amount of light transmitted can be made small.

In particular, in the conventional image-scanning device, high precision in the dimension and parallelism of the frame is required to cause the light axis of lens to agree with the image sensor (the light-receiving element). However, since the frame is generally a resin-molded article, it is not possible to mold it with a high degree of accuracy and its self-shape retention is also low. In this manner, it is difficult to install the rod lens array in the device without inclination. However, in the lens array according to the present invention, the performance of the image-scanning device is not affected even though some displacement is caused during and after forming the frame. Further, the light axis adjustment operation necessary to assemble the lens array becomes easier.

It is also possible to control the deterioration of the light distribution rate resulting from the elevation of the document by employing the light guide with two kinds of reflective curved surfaces.

What is claimed is:

1. A lens array for an image sensor for converging the light from an illuminating device reflected at or transmitted through a document on a light-receiving element, wherein the lens array is formed as an erect 1:1 imaging lens by superimposing lens plates, wherein each lens plate is regularly provided with a number of micro lenses at a predetermined pitch and in a two-dimensional manner, and wherein the lens array has a close-packed structure.

2. The lens array for an image sensor according to claim 1, wherein the lens array is formed by vertically superimposing two or three lens plates and the center of micro lenses of each lens plate agree with one another.

3. The lens array for an image sensor according to claim 1, wherein an angle of aperture of a single lens of the lens array is set between 4 and 10 degrees.

4. An image-scanning device wherein the lens array for an image sensor according to claim 1, the illuminating device, and the light-receiving element are incorporated in a frame.

5. The image-scanning device according to claim 4, wherein the illuminating device is provided which a light guide which reflects the light incident from an end face on the inner surface and causes the light to be emitted from a light-emitting surface provided along the longitudinal direction, wherein the light guide is provided with two kinds of reflective curved surfaces and the collecting position of the light reflected by each curved surface differs.

6. The image-scanning device according to claim 5, wherein the cross-sectional shape of the two kinds of reflective curved surfaces in the direction perpendicular to the longitudinal direction of the light guide is an oval arc or a parabola.

7. The image-scanning device according to claim 4, wherein a ghost cut section is provided between the lens array for an image sensor and the light-receiving element and/or on at least one of the upper parts of the lens array for an image sensor.

* * * * *